(12) United States Patent
Lu

(10) Patent No.: US 10,270,407 B2
(45) Date of Patent: Apr. 23, 2019

(54) PROGRAMMABLE GAIN AMPLIFIER

(71) Applicant: AUCMOS Technologies USA, Inc., Santa Clara, CA (US)

(72) Inventor: Teh-Shang Lu, Sunnyvale, CA (US)

(73) Assignee: CORE CHIP TECHNOLOGY (NANJING) CO., LTD., Nanjing Jiangsu Province (CN)

( * ) Notice: Subject to any disclaimer, the term of this patent is extended or adjusted under 35 U.S.C. 154(b) by 0 days.

(21) Appl. No.: 15/693,097

(22) Filed: Aug. 31, 2017

(65) Prior Publication Data

US 2019/0068149 A1    Feb. 28, 2019

(51) Int. Cl.
*H03G 3/20* (2006.01)
*H03G 1/00* (2006.01)
*H03F 3/45* (2006.01)

(52) U.S. Cl.
CPC ....... *H03G 1/0088* (2013.01); *H03F 3/45475* (2013.01); *H03F 2203/45022* (2013.01); *H03F 2203/45044* (2013.01)

(58) Field of Classification Search
CPC .......................... H03G 1/0088; H03G 3/3026
USPC .................................. 330/86, 282; 327/292
See application file for complete search history.

(56) References Cited

U.S. PATENT DOCUMENTS

| 5,233,309 | A  | * | 8/1993  | Spitalny ................. H03G 3/001 330/144 |
|---|---|---|---|---|
| 5,486,791 | A  |   | 1/1996  | Spitalny et al. |
| 6,310,518 | B1 |   | 10/2001 | Swanson |
| 2009/0079501 | A1 |   | 3/2009  | Watai |
| 2010/0156535 | A1 |   | 6/2010  | Nicollini et al. |
| 2011/0068833 | A1 |   | 3/2011  | Hebert |
| 2011/0234285 | A1 | * | 9/2011  | Kim .................... H03K 17/6872 327/292 |
| 2014/0225673 | A1 | * | 8/2014  | Jordan ..................... H03G 3/30 330/282 |
| 2015/0084693 | A1 |   | 3/2015  | Larson |

OTHER PUBLICATIONS

International Search Report and Written Opinion, PCT/US2018/036042, dated Nov. 2, 2018.

* cited by examiner

*Primary Examiner* — Steven J Mottola
(74) *Attorney, Agent, or Firm* — Edward C. Kwok; VLP Lae Group, LLP

(57) ABSTRACT

A programmable gain amplifier may include: (a) a differential amplifier having first and second input terminals and first and second output terminals, the differential amplifier providing an output signal of the programmable gain amplifier across the first and second output terminals of the differential amplifier; (b) a first set of one or more resistors coupling the first output terminal of the differential amplifier to the first input terminal of the differential amplifier; (c) a second set of one or more resistors coupling the first input terminal of the differential amplifier to a first input terminal of the programmable gain amplifier; and (d) a first set of one or more switches each connected in parallel with one or more resistors in the first or second set of resistors. The first set of switches may include two or more individually programmable switches. Each of the switches may be implemented by an input-signal independent switch disclosed herein.

10 Claims, 4 Drawing Sheets

PROGRAMMABLE GAIN AMPLIFIER

BACKGROUND OF THE INVENTION

1. Field of the Invention

The present invention relates to programmable gain amplifier (PGA) circuits. In particular, the present invention relates technique for providing a PGA circuit with improved programming range and size.

2. Discussion of the Related Art

FIG. 1(a) shows convention programmable gain amplifier (PGA) 100. As shown in FIG. 1(a), PGA 100 includes differential amplifier 101, resistors 102a and 102b, and variable resistors 103a and 103b. PGA 100 receives differential input voltage $V_1$ across input terminals 105a and 105b and provides differential output voltage $V_2$ across output terminals 104a and 104b. In this configuration, the gain of PGA 100—i.e., the ratio of output voltage $V_2$ to input voltage $V_1$—is set by the ratio of resistance value $R_2$ in variable resistor 103a to resistance value $R_1$ in resistor 102a (i.e., $$\frac{V_2}{V_1} = \frac{R_2}{R_1}$$

(The resistance values of variable resistor 103b and resistor 102b between input terminal 102b and output terminal 103b are the same as the resistance values of the corresponding variable resistor 103a and resistor 102a.) As the resistance values in variable resistors 103a and 103b change, the gain of PGA 100 changes proportionally. Alternatively, resistors 102a and 102b may also be implemented as variable resistors which resistance values may be varied independently of variable resistors 103a and 103b to allow a greater range of gains to be achieved.

FIG. 1(b) shows conventional PGA 150. As shown in FIG. 1(b), PGA 150 receives differential input voltage $V_1$ across input terminals 114a and 114b and provides differential output voltage $V_2$ across output terminals 105a and 105b. PGA 150 includes differential amplifiers 110a and 110b, resistors 111a, 111b and 112. Resistors 111a, 111b and 112 may all be implemented by variable resistors. Under this configuration, the gain of PGA 150 is given by:

$$\frac{V_2}{V_1} = 1 + \frac{2R_2}{R_1}$$

Where $R_2$ is the resistance of each of resistors 111a and 111b and $R_1$ is the resistance of resistor 102.

Implementation techniques that allow the resistance values in the variable resistors to be easily varied, especially during normal operations, are desired.

SUMMARY

According to one embodiment of the present invention, a programmable gain amplifier includes: (a) a differential amplifier having first and second input terminals and first and second output terminals, the differential amplifier providing an output signal of the programmable gain amplifier across the first and second output terminals of the differential amplifier; (b) a first set of one or more resistors coupling the first output terminal of the differential amplifier to the first input terminal of the differential amplifier; (c) a second set of one or more resistors coupling the first input terminal of the differential amplifier to a first input terminal of the programmable gain amplifier; and (d) a first set of one or more switches each connected in parallel with one or more resistors in the first or second set of resistors. The first set of switches may include two or more individually programmable switches.

In one embodiment, the programmable gain amplifier further includes: (a) a third set of one or more resistors, substantially the same as the first set of resistors, coupling the second output terminal of the differential amplifier to the second input terminal of the differential amplifier; (b) a fourth set of resistors, substantially the same as the second set of resistors, coupling the second input terminal of the differential amplifier to the second terminal of the programmable gain amplifier; and (c) a second set of one or more switches each connected in parallel with one or more resistors in the third or fourth set of resistors.

In one embodiment, the ratio of resistance values between a selected switch in the first set of switches and a selected switch in the second set of switches are selected to be substantially equals to the gain of the programmable gain amplifier when the selected switches are both closed. Furthermore, the selected switches have a ratio of their relative sizes substantially equal to the gain.

According to one embodiment of the present invention, an input-signal independent switch includes: (a) a transmission gate provided between an input terminal and an output terminal of the input signal-independent switch, the transmission gate having a control gate; (b) first and second pass gates, each pass gate having a first terminal and a second terminal, wherein the first terminal of the first pass gate and the first terminal of the second pass gate are both coupled to the control gate of the transmission gate, and wherein the second terminal of the second pass gate is coupled to a ground reference; (c) a level switching circuit; and (d) a unity-gain amplifier serially connected with the level switching circuit, the unity-gain amplifier and the level switching circuit coupling to the input terminal of the input signal-independent switch to the second terminal of the first pass gate. The level switching circuit provides a bias voltage which is greater than a threshold voltage of the transmission gate.

According to one embodiment of the present invention, a programmable gain amplifier having first and second input terminals and first and second output terminals includes: (a) first and second differential amplifiers each having first and second input terminals and an output terminal; wherein the first input terminal of the first differential amplifier and the first input terminal of the second differential amplifier are coupled respectively to the first and second input terminals of the programmable gain amplifier; (b) first and second resistors, wherein the first resistor couples the output terminal of the first differential amplifier to the second input terminal of the first differential amplifier and the second resistor couples the output terminal of the second differential amplifier to the second input terminal of the second differential amplifier; (c) a set of one or more resistors coupled between the second input terminal of the first differential amplifier and the second input terminal of the second differential amplifier; and (d) one or more switches each connected in parallel with a resistor in the set of one or more resistors. The set of one or more resistors may include first and second serially connected resistors, wherein the one or more switches include a first switch and a second switch, and wherein the first serially connected resistor is connected in parallel with the first switch and the second serially connected resistor is connected in parallel with the second switch. In one embodiment, the first and second serially connected resistors have substantially the same resistance value. In one embodiment, the first and second switches, when conducting, have substantially the same resistance value.

The present invention is better understood upon consideration of the detailed description below in conjunction with the accompanying drawings.

BRIEF DESCRIPTION OF THE DRAWINGS

To simplify the detailed description and to allow cross-reference among the figures, like elements in the figures are assigned like reference numerals.

DETAILED DESCRIPTION OF THE PREFERRED EMBODIMENTS

Figure 1A:
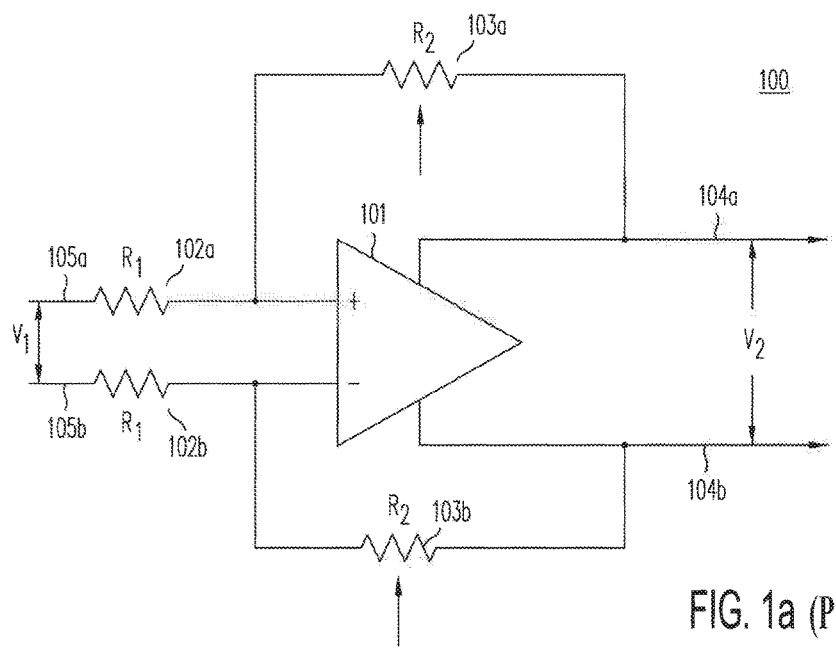
FIG. 1(a) shows conventional programmable gain amplifier (PGA) 100.
Figure 1B:
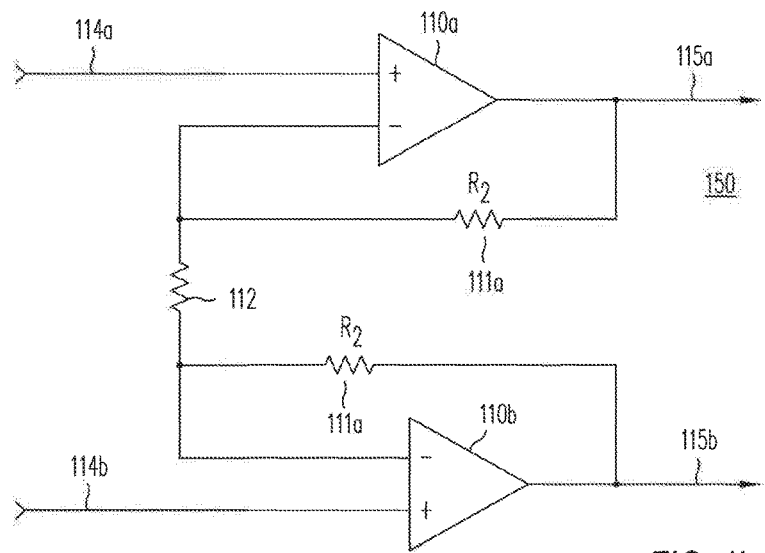
FIG. 1(b) shows conventional PGA 150.
Figure 2:
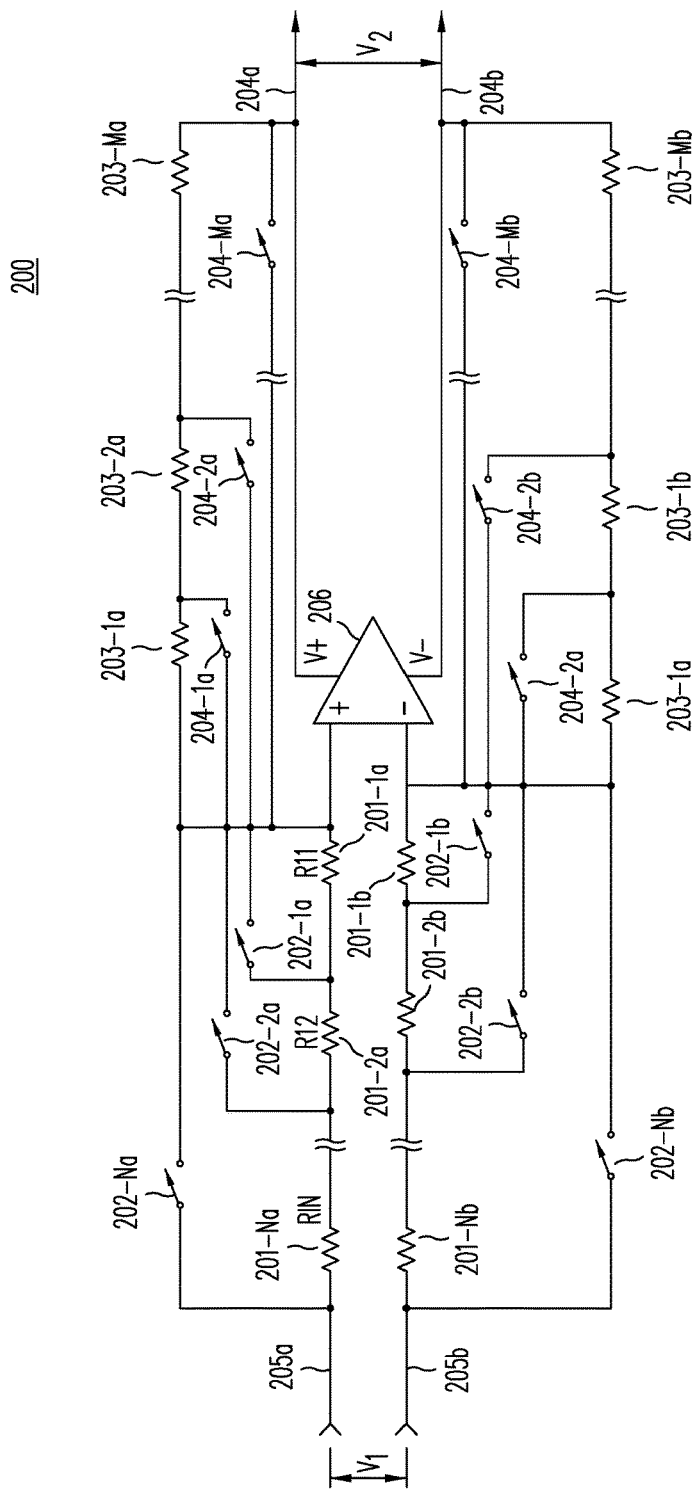
FIG. 2 shows PGA 200, in accordance with one embodiment of the present invention.

FIG. 2 shows PGA 200, according to embodiment of the present invention. As shown in FIG. 2, PGA 200 receives differential input voltage $V_1$ between input terminals 205a and 205b and provides differential output voltage $V_2$ between output terminals 204a and 204b. In PGA 200, a first set of serially-connected resistors 201-1a, 201-2a, . . . 202-Na, where N is an integer, are provided between input terminal 205a and the non-inverting input terminal of differential amplifier 206. A second set of serially-connected resistors 203-1a, 203-2a, . . . , 203-Ma, where M is an integer, are provided between output terminal 204a and the non-inverting input terminal of differential amplifier 206. Likewise, on the inverting input terminal side of differential amplifier 206, a third set of serially-connected resistors 201-1b, 201-2b, . . . , 202-Nb are provided between input terminal 205b and the inverting input terminal of differential amplifier 206, and a fourth set of serially-connected resistors 203-1b, 203-2b, . . . , 203-Mb are provided between output terminal 204b and the inverting input terminal of differential amplifier 206. In addition, a number of individually controlled switches are provided. These switches, when closed, provide current paths that are in parallel with corresponding groups of resistors.

As shown in FIG. 2, switches 202-1a, 202-2a, . . . , 202-Na are each provided to provide parallel current paths to a group of one or more resistors. Specifically, switch 202-1a provides a current path parallel to resistor 201-1a, switch 202-2a provides a current path that is parallel to serially connected resistors 201-1a and 201-2a, . . . , and switch 202-Na provides a current path that is parallel to serially connected resistors 201-1a, 201-2a, . . . , 201-Na. Similarly, (i) switch 202-1b provides a current path that is parallel to resistor 201-1b, switch 202-2b provides a current path that is parallel to serially connected resistors 201-1b and 201-Nb, . . . , and switch 202-Nb provides a current path that is parallel to serially connected resistors 201-1b, 201-2b, . . . , 201-Nb; (ii) switch 204-1a provides a current path that is parallel to resistor 203-1a, switch 204-2a provides a current path that is parallel to serially connected resistors 203-1a and 203-2a, . . . , and switch 204-Ma provides a current path that is parallel to serially connected resistors 203-1a, 203-2a, . . . , 203-Ma; and (iii) switch 204-1b provides a current path that is parallel to resistor 203-1b, switch 204-2b provides a current path that is parallel to serially connected resistors 203-1b and 203-2b, . . . , and switch 204-Mb provides a current path that is parallel to serially connected resistors 203-1b, 203-2b, . . . , 203-Mb. By closing selected switches, different resistance values may be achieved for different gain values.

In FIG. 2, the first set of resistors 201-1a, 201-2a, . . . , 201-Na may each have the same resistance value as its counterpart in the third set of resistors 201-1b, 201-2b, . . . , 201-Nb. Similarly, the second set of resistors 203-1a, 203-2a, . . . , 203-Ma may each have the same resistance value as its counterpart in the fourth set of resistors 203-1b, 203-2b, . . . , 203-Mb. Under that arrangement, when switches 202-na, 202-nb, 204-ka and 204-kb are closed, 1≤n≤N and 1≤k≤M, for relatively small switch resistances, the gain is given by:

$$\frac{V_2}{V_1} = \frac{\sum_{j=k}^{M} R_{jG} + R_{SG}}{\sum_{i=n}^{N} R_i + R_S}$$

where $R_{jG}$ is the resistance of resistor 203-ja or resistor 203-jb, $R_i$ is the resistance of resistor 201-ia or resistor 201-ib, $R_S$ is the resistance of any of switches 202-1a, 202-2a, . . . , 202-Na or switches 202-1b, 202-2b, . . . , 202-Nb, and $R_{SG}$ is the resistance of any of switches 204-1a, 204-2a, . . . , 204-Ma or switches 204-1b, 204-2b, . . . , 204-Mb. (The relatively small switch resistance assumption corresponds to $R_S \ll \sum_{i=1}^{n-1} R_i$ and $R_{SG} \ll \sum_{j=1}^{k-1} R_{jG}$.)

If the resistance ratio between the corresponding closed switches are selected to be close to the expected gain G (i.e.

$$\frac{R_{SG}}{R_S} \approx \frac{\sum_{j=k}^{M} R_{jG}}{\sum_{i=n}^{N} R_i} \approx G),$$

the resulting gain becomes independent of the resistance values of the switches. In the case that the switches are implemented by MOS transistors, the resistance value ratio may be achieved by selecting suitable sizes between the corresponding switches. That is, for example, for switches implemented using MOS transistors of the same channel lengths, $$\frac{R_{SG}}{R_S} \approx G$$

may be achieved by selecting switch 204-*ka* to have a channel width (W) that is G times wider than the channel width of switch 202-*na*.

When the switch resistances at least comparable to the resistors shunted (i.e., the conditions $R_S \ll \sum_{i=1}^{n-1} R_i$ and $R_{SG} \ll \sum_{j=1}^{k-1} R_{jG}$ do not hold), the gain would be given by $$\frac{V_2}{V_1} = \frac{\sum_{j=k}^{M} R_{jG} + R'_{SG}}{\sum_{i=n}^{N} R_i + R'_S},$$

where $R_{SG}'$ and $R^{S'}$ are, respectively, the resistance value of the parallel circuit formed by switch 204-(*n*–1)*a* and resistors 203-1*a*, . . . , 203-(*n*–1)*a* and the resistance value of the parallel circuit formed by switch 202-*ka* and resistors 203-1*a*, . . . , 203-(*k*–1)*a*:

$$R'_{SG} = \frac{R_{SG}\left(\sum_{j=k}^{M} R_{jG}\right)}{R_{SG} + \sum_{j=k}^{M} R_{jG}}$$

$$R'_S = \frac{R_S\left(\sum_{i=n}^{N} R_i\right)}{R_S + \sum_{i=k}^{N} R_i}$$

Again suitable relating sizing of the switches, e.g., $$\frac{R'_{SG}}{R'_S} \approx G,$$

allows the gain of PGA 100 to become independent of switch resistance.

Figure 3:
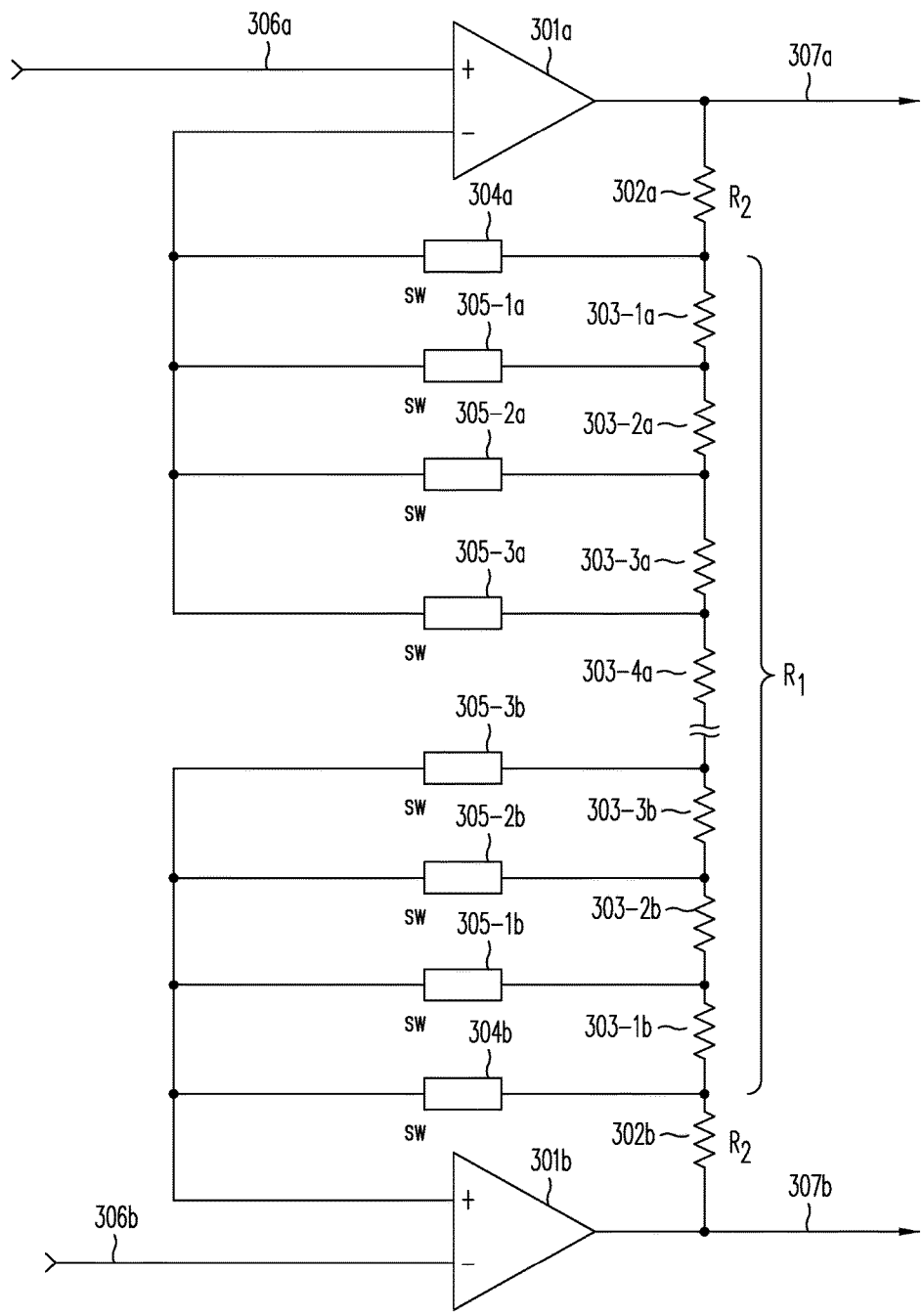
FIG. 3 shows PGA 300, in accordance with one embodiment of the present invention.

FIG. 3 shows PGA 300, in accordance with one embodiment of the present invention. As shown in FIG. 3, PGA 300 receives differential input voltage $V_1$ across input terminals 306*a* and 306*b* and provides differential output voltage $V_2$ across output terminals 307*a* and 307*b*. PGA 300 includes differential amplifiers 301*a* and 301*b*, first and second resistors 302*a* and 302*b*, a first set of serially-connected resistors 303-21*a*, 303-2*a*, . . . , 303-N*a* and a second set of serially connected 303-1*b*, 303-2*b*, . . . , 303-N*b*. Resistors 302*a* and 302*b*. shown in FIG. 3 as each having a resistance $R_2$, may each be provided a parallel current path by a corresponding one of switches 304*a* and 304*b*. In one embodiment, the two set of serially-connected resistors are provided such that each resistor in one set has a counterpart resistor of equal resistance in the other set. Further, resistors 303-1*a*, 303-2*a*, . . . , 303-N*a* may each be provided a parallel current path by a corresponding one of switches 305-1*a*, 305-2*a*, . . . , 303-N*a*. Likewise, resistors 303-1*b*, 303-2*b*, . . . , 303-N*b* may each be provided a parallel current path by a corresponding one of switches 305-1*b*, 305-2*b*, . . . , 303-N*b*. In FIG. 3, the total resistance of the serially-connected sets of resistors is $R_1$.

The gain of PGA 500 is set by providing parallel current paths to selected resistors (i.e., by closing the selected corresponding switches). Thus, for a relatively small switch resistance, the gain is given by:

$$\frac{V_2}{V_1} = 1 + \frac{2R_2}{\sum_{j\,open} R_j}$$

where $R_j$ is the resistance of resistor 303-*ja* or resistor 303-*jb*, where the sum is over all resistors that are not provided parallel current paths. In this regard, the "relatively small switch resistance" means that the resistance $R_{Sj}$ of closed switch 304-*ja* or switch 304-*jb* is much less than the corresponding resistance of resistor 303-*ja* or resistor 303-*jb*. However, if the assumption of relative small switch resistance does not hold (i.e., the resistance $R_{Sj}$ of closed switch 304-*ja* or switch 304-*jb* is not much less than the corresponding resistance of resistor 303-*ja* or resistor 303-*jb*), then the gain is given by:

$$\frac{V_2}{V_1} = 1 + \frac{2R_2}{\sum_{j\,closed} R'_{Sj} + \sum_{open} R_j}$$

where $R_{Sj}'$ is the resistance of the parallel circuit that includes closed switch 305-*ja* or 305-*jb* and resistor 303-*ja* or 303-*jb*.

As discussed above, the switches in FIGS. 2 and 3 may be implemented as pass gates (or transmission gates) using MOS transistors. Note that the resistance ("RDS-on") of a conducting pass gate (i.e., a closed MOS transistor switch) is given by:

$$RDS_{on} = \frac{1}{\beta\frac{W}{L}(V_{GS} - V_T)}$$

where β is a proportionality constant, W and L are respectively the channel width and the channel length of the MOS transistor, $V_{GS}$ and $V_T$ are respectively the gate-to-source voltage and the threshold voltage of the MOS transistor. In a pass gate configuration, $V_{GS}=V_G-V_{IN}$, where $V_G$ is the voltage at the gate electrode and $V_{IN}$ is the input voltage to the pass gate. Therefore, when implementing the switches in FIGS. 2 and 3 by pass gates, their resistance values would depend on input signal $V_{IN}$, which may not desirable in many applications. The present invention provides a switch that has an input signal-independent resistance value.

Figure 4:
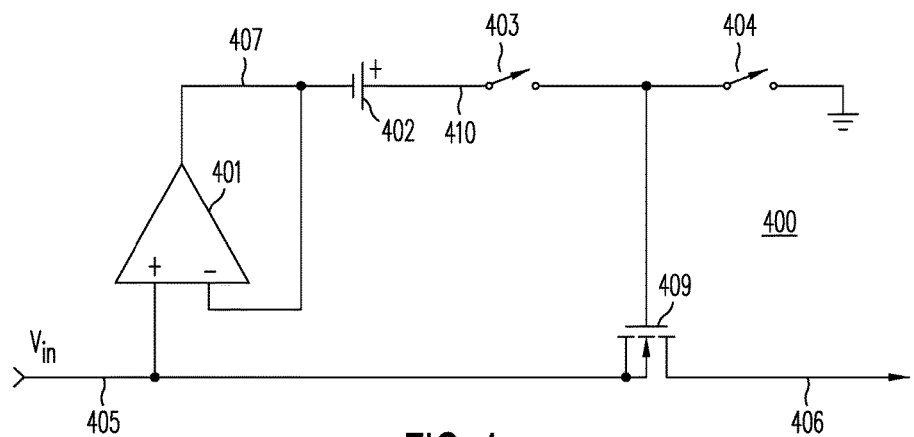
FIG. 4 shows input signal-independent switch 400 which may be used to implement any of the switches in FIGS. 2 and 3, in accordance with one embodiment of the present invention.

FIG. 4 shows input signal-independent switch 400 which may be used to implement any of the switches in FIGS. 2 and 3, in accordance with one embodiment of the present invention. As shown in FIG. 4, switch 400 includes amplifier 401 in a unity-gain configuration, which provides input signal $V_{IN}$ at terminal 405 to output terminal 407 of amplifier 401. Level shifting circuit 402 (represented by voltage source 402 in FIG. 4) adds additional voltage $V_{bias}$ to the voltage at terminal 407. Switch 400 includes switches 403 and 404, which may each be implemented by a pass gate. Switch 403 is closed when switch 404 is open, and vice versa. When switch 404 is closed, the common ground voltage is provided to the gate electrode of MOS transistor 509, thereby blocking input signal VN from reaching output terminal 406. In such condition, input signal-independent switch 400 serves an open switch.

Alternatively, when switch 403 is conducting (i.e., switch 403 is closed), the output voltage of level-shifting circuit 402 (minus a voltage drop across switch 403) is provided to the gate terminal of MOS transistor 409 (i.e., $V_G = V_{IN} + V_{bias}$). Additional voltage $V_{bias}$ is selected to be greater than the threshold voltage of MOS transistor 409, so that, regardless of the value $V_{IN}$, MOS transistor 409 is conducting. Thus, when the switch 403 is conducting, input signal-independent switch 400 serves as a closed switch. In this configuration, the effective resistance $RDS_{ON}$ of switch 400 is given by:

$$RDS_{on} = \frac{1}{\beta\frac{W}{L}(V_{GS} - V_T)} = \frac{1}{\beta\frac{W}{L}(V_{IN} + V_{bias} - V_{IN} - V_T)} = \frac{1}{\beta\frac{W}{L}(V_{bias} - V_T)}$$

Accordingly, input signal-independent switch 400 has an "on" resistance value that is independent of the input voltage.

Figure 5:
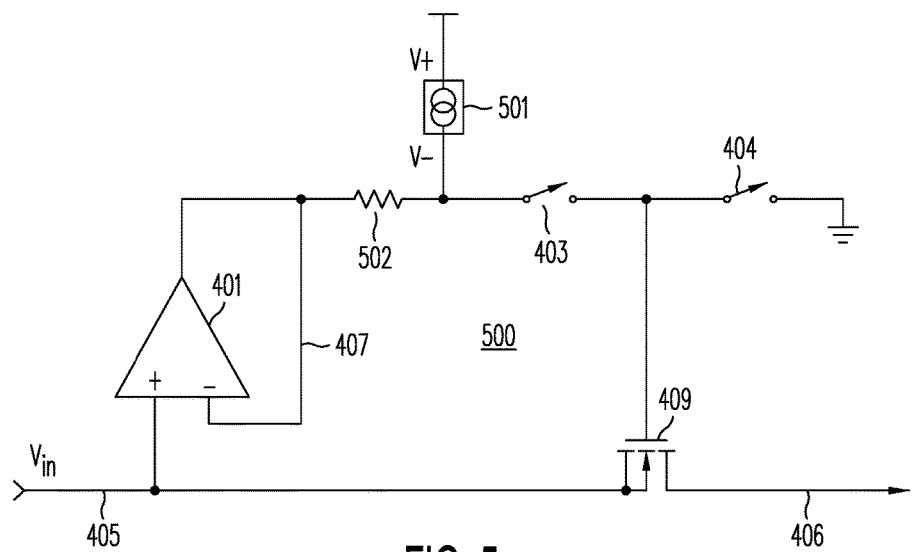
FIG. 5 shows input signal-independent switch 500 which is one implementation of signal-independent switch 400 of FIG. 4, in accordance with one embodiment of the present invention.

FIG. 5 shows input signal-independent switch 500 which is one implementation of signal-independent switch 400 of FIG. 4, in accordance with one embodiment of the present invention. In FIG. 5, level switching circuit 402 is implemented by current source 501 and resistor 502. Resistor 502 may be implemented by the on-resistance ("RDS-on") of a suitably-biased conducting MOS resistor of a predetermined size.

The above detailed description is provided to illustrate specific embodiments of the present invention and is not intended to be limiting. Various modifications and variations within the scope of the present invention are possible. The present invention is set forth in the accompanying claims.

I claim:

1. A programmable gain amplifier receiving an input signal across a first input terminal and a second input terminal and providing an output signal, comprising:
   a differential amplifier having first and second input terminals and first and second output terminals, the differential amplifier providing the output signal across the first and second output terminals of the differential amplifier;
   a first set of one or more resistors coupling the first output terminal of the differential amplifier to the first input terminal of the differential amplifier;
   a second set of one or more resistors coupling the first input terminal of the differential amplifier to the first input terminal of the programmable gain amplifier; and
   a first set of one or more switches each connected in parallel with one or more resistors in the first or second set of resistors, wherein the first set of switches comprise two or more individually programmable switches, in which a first switch is connected in parallel with one or more resistors in the first set of resistors and a second switch is connected in parallel with one or more resistors in the second set of resistors.

2. The programmable gain amplifier of claim 1, further comprising:
   a third set of one or more resistors, substantially the same as the first set of resistors, coupling the second output terminal of the differential amplifier to the second input terminal of the differential amplifier;
   a fourth set of resistors, substantially the same as the second set of resistors, coupling the second input terminal of the differential amplifier to the second terminal of the programmable gain amplifier; and
   a second set of one or more switches each connected in parallel with one or more resistors in the third or fourth set of resistors.

3. The programmable gain amplifier of claim 1, wherein the ratio of a resistance of the first switch to a resistance of the second switch substantially equals to a gain of the programmable gain amplifier when the first and the second switches are both closed.

4. The programmable gain amplifier of claim 3, wherein the first and second switches have a ratio of their relative sizes substantially equal to the gain.

5. The programmable gain amplifier of claim 1 wherein each switch in the first set of switches is input signal-independent.

6. The programmable gain amplifier of claim 5, wherein each input-signal independent switch has an input terminal and an output terminal, wherein the input signal-independent switch comprises:
   a transmission gate provided between the input and output terminals of the input signal-independent switch, the transmission gate having a control gate;
   first and second pass gates, each pass gate having a first terminal and a second terminal, wherein the first terminal of the first pass gate and the first terminal of the second pass gate are both coupled to the control gate of the transmission gate, and wherein the second terminal of the second pass gate is coupled to a ground reference;
   a level switching circuit; and
   a unity-gain amplifier serially connected with the level switching circuit, the unity-gain amplifier and the level switching circuit coupling to the input terminal of the input signal-independent switch to the second terminal of the first pass gate.

7. The programmable gain amplifier of claim 5, wherein the level switching circuit provides a bias voltage which is greater than a threshold voltage of the transmission gate.

8. An input signal-independent switch having an input terminal and an output terminal, comprising:
   a transmission gate provided between the input and output terminals of the input signal-independent switch, the transmission gate having a control gate;
   first and second pass gates, each pass gate having a first terminal and a second terminal, wherein the first terminal of the first pass gate and the first terminal of the second pass gate are both coupled to the control gate of the transmission gate, and wherein the second terminal of the second pass gate is coupled to a ground reference;
   a level switching circuit, which provides a bias voltage which is greater than a threshold voltage of the transmission gate; and
   a unity-gain amplifier serially connected with the level switching circuit, the unity-gain amplifier and the level switching circuit coupling to the input terminal of the input signal-independent switch to the second terminal of the first pass gate.

9. The input signal-independent switch of claim 8, wherein the level switching circuit comprises a current source and a resistor of a predetermined resistance.

10. The input signal-independent switch of claim 9, wherein the resistor is implemented by a conducting MOS transistor.

* * * * *